(12) United States Patent
Bhaskar et al.

(10) Patent No.: US 11,580,375 B2
(45) Date of Patent: *Feb. 14, 2023

(54) ACCELERATED TRAINING OF A MACHINE LEARNING BASED MODEL FOR SEMICONDUCTOR APPLICATIONS

(71) Applicant: KLA-Tencor Corporation, Milpitas, CA (US)

(72) Inventors: Kris Bhaskar, San Jose, CA (US); Laurent Karsenti, Rehovot (IL); Scott Young, Soquel, CA (US); Mohan Mahadevan, Livermore, CA (US); Jing Zhang, Santa Clara, CA (US); Brian Duffy, San Jose, CA (US); Li He, San Jose, CA (US); Huajun Ying, San Jose, CA (US); Hung Nien, San Jose, CA (US); Sankar Venkataraman, Milpitas, CA (US)

(73) Assignee: KLA-Tencor Corp., Milpitas, CA (US)

(*) Notice: Subject to any disclaimer, the term of this patent is extended or adjusted under 35 U.S.C. 154(b) by 1719 days.

This patent is subject to a terminal disclaimer.

(21) Appl. No.: 15/394,790

(22) Filed: Dec. 29, 2016

(65) Prior Publication Data

US 2017/0193400 A1 Jul. 6, 2017

Related U.S. Application Data

(60) Provisional application No. 62/273,985, filed on Dec. 31, 2015.

(51) Int. Cl.
*G06N 3/08* (2006.01)
*G01Q 30/02* (2010.01)
(Continued)

(52) U.S. Cl.
CPC .............. *G06N 3/08* (2013.01); *G01Q 30/02* (2013.01); *G06N 3/067* (2013.01); *G06N 20/00* (2019.01);
(Continued)

(58) Field of Classification Search
CPC .............. G06F 30/20; G06F 17/5009; G06N 3/0454; G06N 99/005; G06N 3/0472;
(Continued)

(56) References Cited

U.S. PATENT DOCUMENTS

| 5,212,765 A | 5/1993 | Skeirik |
| 6,818,360 B1 * | 11/2004 | Phan .................. G01N 21/47 356/237.1 |

(Continued)

FOREIGN PATENT DOCUMENTS

| CN | 102937784 | 2/2013 |
| CN | 111819583 | 10/2020 |

(Continued)

OTHER PUBLICATIONS

Goodfellow et al., "Dee Learning" 2016, pp. 1-777. (Year: 2016).*

(Continued)

*Primary Examiner* — Miranda M Huang
*Assistant Examiner* — Chase P. Hinckley
(74) *Attorney, Agent, or Firm* — Ann Marie Mewherter

(57) ABSTRACT

Methods and systems for accelerated training of a machine learning based model for semiconductor applications are provided. One method for training a machine learning based model includes acquiring information for non-nominal instances of specimen(s) on which a process is performed. The machine learning based model is configured for performing simulation(s) for the specimens. The machine learning based model is trained with only information for nominal instances of additional specimen(s). The method also (Continued)

includes re-training the machine learning based model with the information for the non-nominal instances of the specimen(s) thereby performing transfer learning of the information for the non-nominal instances of the specimen(s) to the machine learning based model.

37 Claims, 3 Drawing Sheets

(51) Int. Cl.
    *G06N 3/067*     (2006.01)
    *G06N 20/00*     (2019.01)
    *G06N 3/04*       (2023.01)
    *G06F 30/20*     (2020.01)

(52) U.S. Cl.
    CPC ............ *G06F 30/20* (2020.01); *G06N 3/0454* (2013.01); *G06T 2207/10061* (2013.01)

(58) Field of Classification Search
    CPC .......... G06N 3/088; G06N 3/08; G06N 3/067; G01N 21/9501; G01N 2201/1296; G03F 7/705; G03F 7/70616; G03F 7/70633; G06K 9/6262; G06K 2209/19; G06T 7/0004; G06T 2207/20081; G06T 2207/20084; G06T 2207/10061; H01L 22/12; G01Q 30/02
    USPC ......................................................... 706/12
    See application file for complete search history.

(56) References Cited

U.S. PATENT DOCUMENTS

| | | | |
|---|---|---|---|
| 6,891,627 B1 | 5/2005 | Levy et al. | |
| 6,902,855 B2 | 6/2005 | Peterson et al. | |
| 7,167,583 B1 | 1/2007 | Lipson et al. | |
| 7,418,124 B2 | 8/2008 | Peterson et al. | |
| 7,570,796 B2 | 8/2009 | Zafar et al. | |
| 7,676,077 B2* | 3/2010 | Kulkarni ............. | G06F 17/5045 382/144 |
| 7,729,529 B2* | 6/2010 | Wu .................. | G01N 21/95607 382/144 |
| 7,769,225 B2 | 8/2010 | Kekare et al. | |
| 8,041,106 B2 | 10/2011 | Pak et al. | |
| 8,111,900 B2 | 2/2012 | Wu et al. | |
| 8,126,255 B2 | 2/2012 | Bhaskar et al. | |
| 8,213,704 B2 | 7/2012 | Peterson et al. | |
| 8,664,594 B1 | 4/2014 | Jiang et al. | |
| 8,692,204 B2 | 4/2014 | Kojima et al. | |
| 8,698,093 B1 | 4/2014 | Gubbens et al. | |
| 8,716,662 B1 | 5/2014 | MacDonald et al. | |
| 9,222,895 B2 | 12/2015 | Duffy et al. | |
| 10,365,617 B2* | 7/2019 | Lin .................. | G05B 19/41875 |
| 2004/0078108 A1* | 4/2004 | Choo ................ | G01N 21/4738 700/121 |
| 2006/0159330 A1* | 7/2006 | Sakai ................. | G06T 7/0004 382/141 |
| 2008/0072207 A1 | 3/2008 | Verma et al. | |
| 2008/0103996 A1 | 5/2008 | Forman et al. | |
| 2008/0255786 A1 | 10/2008 | Jin et al. | |
| 2009/0198635 A1 | 8/2009 | Doddi et al. | |
| 2012/0022836 A1 | 1/2012 | Ferns et al. | |
| 2012/0123748 A1* | 5/2012 | Aben ................... | G03F 7/705 703/2 |
| 2012/0191630 A1 | 7/2012 | Breckenridge et al. | |
| 2012/0226644 A1 | 9/2012 | Jin et al. | |
| 2012/0323356 A1 | 12/2012 | Dziura et al. | |
| 2013/0110477 A1* | 5/2013 | Pandev ............. | G03F 7/70625 703/2 |
| 2013/0151440 A1 | 6/2013 | Li et al. | |
| 2013/0158957 A1* | 6/2013 | Lee .................. | G06F 30/20 703/1 |
| 2013/0159943 A1* | 6/2013 | Agarwal ............. | G03F 7/70441 716/52 |
| 2013/0262044 A1 | 10/2013 | Pandev et al. | |
| 2013/0279796 A1* | 10/2013 | Kaizerman ............. | G06T 7/001 382/149 |
| 2013/0282340 A1 | 10/2013 | Liu et al. | |
| 2014/0172394 A1* | 6/2014 | Kuznetsov .......... | G06F 17/5009 703/6 |
| 2014/0316730 A1* | 10/2014 | Shchegrov ............. | H01L 22/20 702/81 |
| 2014/0358488 A1* | 12/2014 | Lee ..................... | G03F 7/70616 702/190 |
| 2015/0046121 A1 | 2/2015 | Dziura et al. | |
| 2015/0058813 A1* | 2/2015 | Kim ................... | G03F 7/70616 716/52 |
| 2015/0213596 A1* | 7/2015 | Tandi ................ | G01N 21/9501 382/149 |
| 2015/0235108 A1* | 8/2015 | Pandev ............... | G06K 9/6255 382/149 |
| 2015/0330915 A1* | 11/2015 | Jin ......................... | H01L 22/12 378/62 |
| 2016/0148850 A1* | 5/2016 | David ................... | G06N 7/005 438/5 |
| 2016/0313651 A1* | 10/2016 | Middlebrooks ......... | G03F 7/705 |
| 2016/0341670 A1* | 11/2016 | Vagos ................ | G01N 21/8851 |
| 2017/0140524 A1 | 5/2017 | Karsenti et al. | |
| 2017/0148226 A1 | 5/2017 | Zhang et al. | |
| 2017/0177997 A1* | 6/2017 | Karlinsky ................ | G06N 3/08 |
| 2017/0315055 A1* | 11/2017 | Tinnemans ....... | G01N 21/95607 |
| 2017/0357895 A1 | 12/2017 | Karlinsky et al. | |
| 2018/0314163 A1* | 11/2018 | Liu ..................... | G03F 7/70491 |
| 2019/0147127 A1* | 5/2019 | Su .......................... | G03F 7/705 |
| 2019/0294923 A1 | 9/2019 | Riley et al. | |

FOREIGN PATENT DOCUMENTS

| | | |
|---|---|---|
| TW | 201211789 | 3/2012 |
| TW | 201243738 | 11/2012 |
| TW | 201314174 | 4/2013 |
| TW | 201346214 | 11/2013 |
| TW | 201732690 | 9/2017 |

OTHER PUBLICATIONS

International Search Report for PCT/US2016/069580 dated Apr. 11, 2017.

U.S. Appl. No. 15/176,139, filed Jun. 7, 2016 by Zhang et al. (submitted as U.S. Patent Application Publication No. 2017/0148226 published May 25, 2017 by Zhang et al.).

U.S. Appl. No. 15/353,210, filed Nov. 16, 2016 by Karsenti et al. (submitted as U.S. Patent Application Publication No. 2017/0140524 published May 18, 2017 by Karsenti et al.).

Goodfellow et al., "Generative Adversarial Nets," arXiv:1406.2661v1, Jun. 10, 2014, 9 pages.

Jebara, "Discriminative, Generative, and Imitative Learning," Massachusetts Institute of Technology, MIT Thesis, Feb. 2002, 212 pages.

Kingma et al., "Semi-supervised Learning with Deep Generative Models," NIPS 2014, arXiv:1406.5298v2, Oct. 31, 2014, 9 pages.

Makhzani et al., "Adversarial Autoencoders," arXiv:1511.05644v2, May 25, 2016, 16 pages.

Neal, "Bayesian Learning for Neural Networks," Springer-Verlag New York, 1996, 204 pages.

Rasmus et al., "Semi-Supervised Learning with Ladder Networks," arXiv1507.02672v2, NIPS 2015, Nov. 24, 2015, 19 pages.

Šmidl et al., "The Variational Bayes Method in Signal Processing," Springer-Verlag Berlin Heidelberg, 2006, 228 pages.

Szegedy et al., "Going Deeper with Convolutions," 2015 IEEE Conference on Computer Vision and Pattern Recognition (CVPR), Jun. 2015, 9 pages.

Torrey et al., "Transfer Learning," Handbook of Research on Machine Learning Applications, published by IGI Global, edited by E. Soria, J. Martin, R. Magdalena, M. Martinez and A. Serrano, 2009, 22 pages.

(56) References Cited

OTHER PUBLICATIONS

Yosinski et al., "How transferable are features in deep neural networks?," Advances in Neural Information Processing Systems 27 (NIPS '14), NIPS Foundation 2014, Nov. 6, 2014, 14 pages.
Supplementary European Search Report for European Patent Application No. EP 16 88 2778 dated Jul. 16, 2019.
Hand et al., "Principles of Data Mining (Adaptive Computation and Machine Learning)," MIT Press, 2001, 578 pages.
Sugiyama, "Introduction to Statistical Machine Learning," Morgan Kaufmann, 2016, 534 pages.
Jin et al., "The Preprocessing of Training Samples for Arlilicial Neural Network of Periodic Defected Ground Structure," Research and Progress of SSE, vol. 25, No. 3, Aug. 2005, 7 pages.

* cited by examiner

ACCELERATED TRAINING OF A MACHINE LEARNING BASED MODEL FOR SEMICONDUCTOR APPLICATIONS

BACKGROUND OF THE INVENTION

1. Field of the Invention

The present invention generally relates to methods and systems for accelerated training of a machine learning based model for semiconductor applications.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to drive higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

Defect review typically involves re-detecting defects detected as such by an inspection process and generating additional information about the defects at a higher resolution using either a high magnification optical system or a scanning electron microscope (SEM). Defect review is therefore performed at discrete locations on the wafer where defects have been detected by inspection. The higher resolution data for the defects generated by defect review is more suitable for determining attributes of the defects such as profile, roughness, more accurate size information, etc.

Metrology processes are also used at various steps during a semiconductor manufacturing process to monitor and control the process. Metrology processes are different than inspection processes in that, unlike inspection processes in which defects are detected on a wafer, metrology processes are used to measure one or more characteristics of the wafer that cannot be determined using currently used inspection tools. For example, metrology processes are used to measure one or more characteristics of a wafer such as a dimension (e.g., line width, thickness, etc.) of features formed on the wafer during a process such that the performance of the process can be determined from the one or more characteristics. In addition, if the one or more characteristics of the wafer are unacceptable (e.g., out of a predetermined range for the characteristic(s)), the measurements of the one or more characteristics of the wafer may be used to alter one or more parameters of the process such that additional wafers manufactured by the process have acceptable characteristic(s).

Metrology processes are also different than defect review processes in that, unlike defect review processes in which defects that are detected by inspection are re-visited in defect review, metrology processes may be performed at locations at which no defect has been detected. In other words, unlike defect review, the locations at which a metrology process is performed on a wafer may be independent of the results of an inspection process performed on the wafer. In particular, the locations at which a metrology process is performed may be selected independently of inspection results.

Current algorithms that are used in most semiconductor applications like inspection tend to require hand crafted features. There is learning involved in the system, but it tends to happen in an ad hoc manner and at a very high ("lossy") level where there is a loop typically involving a SEM review where the results of the inspection are deemed as true defects, false alarms, nuisance, etc. By "lossy," we mean that the relationships between process-related causes and our ability to observe the effects are so complex that conventional methods do not lend themselves to converging on recipes that take full advantage of the raw capability of the metrology and inspection equipment used to control the semiconductor manufacturing process.

It should also be noted that rigorous process simulation design of experiments (DOES) through process window can also be employed. However, they are much slower and require pre-optical proximity correction (OPC) data. (input to mask writer), which is often not available in the fab. For example, a product named Design Scan, which was developed by KLA-Tencor, Milpitas, Calif., endeavored to predict the pattern variations that occur through the lithography process window.

The field of neural network learning is littered with decades of unsuccessful attempts at unsupervised learning. However, in the last two years, we discovered that some in the research community have had a fair amount of success in natural image scene classification in leveraging techniques related to transfer learning and semi-supervised learning for character recognition.

Deep learning models work well under the assumption that there are plenty of samples for the deep neural network to work on. When there are very few sample examples to work with, success with these methods tends to be quite limited.

Accordingly, it would be advantageous to develop systems and methods for training a machine learning based model that do not have one or more of the disadvantages described above.

SUMMARY OF THE INVENTION

The following description of various embodiments is not to be construed in any way as limiting the subject matter of the appended claims.

One embodiment relates to a system configured to train a machine learning based model. The system includes one or more computer subsystems and one or more components executed by the one or more computer subsystems. The one or more components include a machine learning based model configured for performing one or more simulations for specimens. The machine learning based model is trained with only information for nominal instances of one or more of the specimens. The one or more computer subsystems are configured for acquiring information for non-nominal instances of one or more of the specimens on which a process is performed. The one or more computer subsystems are also configured for re-training the machine learning based model with the information for the non-nominal instances of the one or more of the specimens thereby performing transfer learning of the information for the non-nominal instances of the one or more of the specimens to the machine learning based model. The system may be further configured as described herein.

Another embodiment relates to a computer-implemented method for training a machine learning based model. The method includes acquiring information for non-nominal instances of one or more specimens on which a process is performed. A machine learning based model is configured for performing one or more simulations for the specimens. The machine learning based model is trained with only information for nominal instances of one or more additional specimens. The method also includes re-training the machine learning based model with the information for the non-nominal instances of the one or more specimens thereby performing transfer learning of the information for the non-nominal instances of the one or more specimens to the machine learning based model. The acquiring and re-training are performed by one or more computer systems. One or more components are executed by the one or more computer systems. The one or more components include the machine learning based model.

Each of the steps of the method described above may be further performed as described further herein. In addition, the embodiment of the method described above may include any other step(s) of any other method(s) described herein. Furthermore, the method described above may be performed by any of the systems described herein.

Another embodiment relates to a non-transitory computer-readable medium storing program instructions executable on one or more computer systems for performing a computer-implemented method for training a machine learning based model. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
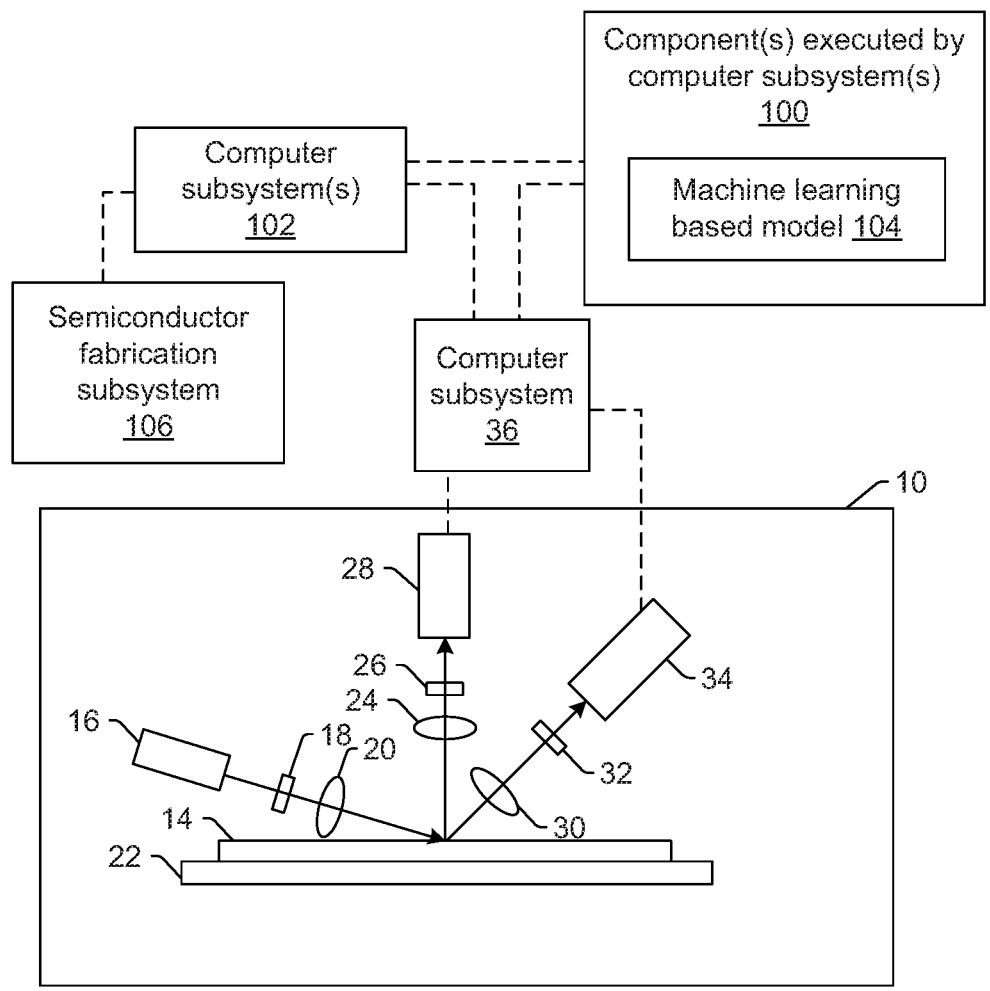
FIGS. 1 and 1a are schematic diagrams illustrating side views of embodiments of a system configured as described herein.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design," "design data," and "design information" as used interchangeably herein generally refer to the physical design (layout) of an IC and data derived from the physical design through complex simulation or simple geometric and Boolean operations. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al, both of which are incorporated by reference as if fully set forth herein. In addition, the design data can be standard cell library data, integrated layout data, design data for one or more layers, derivatives of the design data, and full or partial chip design data.

In addition, the "design," "design data," and "design information" described herein refers to information and data that is generated by semiconductor device designers in a design process and is therefore available for use in the embodiments described herein well in advance of printing of the design on any physical specimens such as reticles and wafers.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a system configured to train a machine learning based model. The embodiments described herein provide systems and methods for accelerating learning based systems when training samples are relatively limited. The embodiments described herein may be utilized for a variety of semiconductor manufacturing related applications including, but not limited to, inspection, metrology, defect review, and simulation.

One embodiment of such a system is shown in FIG. 1. The system includes one or more computer subsystems (e.g., computer subsystems 36 and 102) and one or more components 100 executed by the one or more computer subsystems. The one or more components include machine learning based model 104 configured for performing one or more simulations for specimens. As described further herein, the machine learning based model is trained with only information for nominal instances of one or more of the specimens.

In some embodiments, the system includes optical based imaging subsystem 10. In general, the optical based imaging subsystem is configured to generate optical images of the specimens, and the one or more computer subsystems are configured for receiving the optical images from the optical based imaging subsystem. The optical based imaging subsystem may also be configured to generate the optical images with multiple modes.

In one embodiment, the specimens include wafers. The wafers may include any wafers known in the art. In another embodiment, the specimens include reticles. The reticles may include any reticles known in the art.

The optical based imaging subsystem may generate the optical images by directing light to or scanning light over the specimens and detecting light from the specimens. In one such example, in the embodiment of the system shown in FIG. 1, optical based imaging subsystem 10 includes an illumination subsystem configured to direct light to specimen 14. The illumination subsystem includes at least one light source. For example, as shown in FIG. 1, the illumination subsystem includes light source 16. In one embodiment, the illumination subsystem is configured to direct the light to the specimen at one or more angles of incidence, which may include one or more oblique angles and/or one or more normal angles. For example, as shown in FIG. 1, tight from light source 16 is directed through optical element 18 and then lens 20 to specimen 14 at an oblique angle of incidence. The oblique angle of incidence may include any suitable oblique angle of incidence, which may vary depending on, for instance, characteristics of the specimen.

The optical based imaging subsystem may be configured to direct the light to the specimen at different angles of incidence at different times. For example, the optical based imaging subsystem may be configured to alter one or more characteristics of one or more elements of the illumination subsystem such that the light can be directed to the specimen at an angle of incidence that is different than that shown in FIG. 1. In one such example, the optical based imaging subsystem may be configured to move light source 16, optical element 18, and lens 20 such that the light is directed to the specimen at a different oblique angle of incidence or a normal (or near normal) angle of incidence.

In some instances, the optical based imaging subsystem may be configured to direct light to the specimen at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example, in some instances, optical element 18 may be configured as a spectral filter and the properties of the spectral filter can be changed in a variety of different ways (e.g., by swapping out the spectral filter) such that different wavelengths of light can be directed to the specimen at different times. The illumination subsystem may have any other suitable configuration known in the art for directing the light having different or the same characteristics to the specimen at different or the same angles of incidence sequentially or simultaneously.

In one embodiment, light source 16 may include a broadband plasma (BBP) light source. In this manner, the light generated by the light source and directed to the specimen may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused onto specimen 14 by lens 20. Although lens 20 is shown in FIG. 1 as a single refractive optical element, it is to be understood that, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the optical based imaging subsystem may be configured to alter one or more of the elements of the illumination subsystem based on the type of illumination to be used for imaging.

The optical based imaging subsystem may also include a scanning subsystem configured to cause the light to be scanned over the specimen. For example, the optical based imaging subsystem may include stage 22 on which specimen 14 is disposed during imaging. The scanning subsystem may include any suitable mechanical and/or robotic assembly (that includes stage 22) that can be configured to move the specimen such that the light can be scanned over the specimen. In addition, or alternatively, the optical based imaging subsystem may be configured such that one or more optical elements of the optical based imaging subsystem perform some scanning of the light over the specimen. The light may be scanned over the specimen in any suitable fashion such as in a serpentine-like path or in a spiral path.

The optical based imaging subsystem further includes one or more detection channels. At least one of the one or more detection channels includes a detector configured to detect light from the specimen due to illumination of the specimen by the system and to generate output responsive to the detected light. For example, the optical based imaging subsystem shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, both detection channels are configured to detect scattered light, and the detection channels are configured to detect light, that is scattered at different angles from the specimen. However, one or more of the detection channels may be configured to detect another type of light from the specimen (e.g., reflected light).

As further shown in FIG. 1, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 30, element 32, and detector 34 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 1 shows an embodiment of the optical based imaging subsystem that includes two detection channels, the optical based imaging subsystem may include a different number of detection channels (e.g., only one detection channel or two or more detection channels). In one such instance, the detection channel formed by collector 30, element 32, and detector 34 may form one side channel as described above, and the optical based imaging subsystem may include an additional detection channel (not shown) formed as another side channel that is positioned on the opposite side of the plane of incidence. Therefore, the optical based imaging subsystem may include the detection channel that includes collector 24, element 26, and detector 28 and that is centered in the plane of incidence and configured to collect and detect light at scattering angle(s) that are at or close to normal to the specimen surface. This detection channel may therefore be commonly referred to as a "top" channel, and the optical based imaging subsystem may also include two or more side channels configured as described above. As such, the optical based imaging subsystem may include at least three channels (i.e., one top channel and two side channels), and each of the at least three channels has its own collector, each of which is configured to collect light at different scattering angles than each of the other collectors.

As described further above, each of the detection channels included in the optical based imaging subsystem may be configured to detect scattered light. Therefore, the optical based imaging subsystem shown in FIG. 1 may be configured for dark field (DF) imaging of specimens. However, the optical based imaging subsystem may also or alternatively include detection channel(s) that are configured for bright field (BF) imaging of specimens. In other words, the optical based imaging subsystem may include at least one detection channel that is configured to detect light specularly reflected from the specimen. Therefore, the optical based imaging subsystems described herein may be configured for only DF, only BF, or both DF and BF imaging. Although each of the collectors are shown in FIG. 1 as single refractive optical elements, it is to be understood that each of the collectors may include one or more refractive optical element(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based imaging subsystem may be signals or data, but not image signals or image data. In such instances, a computer subsystem such as computer subsystem 36 may be configured to generate images of the specimen from the non-imaging output of the detectors. However, in other instances, the detectors may be configured as imaging detectors that are configured to generate imaging signals or image data. Therefore, the optical based imaging subsystem may be configured to generate the optical images described herein in a number of ways.

It is noted that FIG. 1 is provided herein to generally illustrate a configuration of an optical based imaging subsystem that may be included in the system embodiments described herein or that may generate images that are used by the system embodiments described herein. Obviously, the optical based imaging subsystem configuration described herein may be altered to optimize the performance of the optical based imaging subsystem as is normally performed when designing a commercial imaging system. In addition, the systems described herein may be implemented using an existing system (e.g., by adding functionality described herein to an existing system) such as the 29xx/28xx series of tools that are commercially available from KLA-Tencor, Milpitas, Calif. For some such systems, the embodiments described herein may be provided as optional functionality of the system (e.g., in addition to other functionality of the system). Alternatively, the optical based imaging subsystem described herein may be designed "from scratch" to provide a completely new optical based imaging subsystem.

Computer subsystem 36 coupled to the optical based imaging subsystem may be coupled to the detectors of the optical based imaging subsystem in any suitable manner (e.g., via one or more transmission media, which may include "wired" and/or "wireless" transmission media) such that the computer subsystem can receive the output generated by the detectors for the specimen. Computer subsystem 36 may be configured to perform a number of functions described further herein using the output of the detectors.

The computer subsystems shown in FIG. 1 (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, computer subsystem 36 may be coupled to computer subsystem(s) 102 as shown by the dashed line in FIG. 1 by any suitable transmission media, which may include any suitable wired and/or wireless transmission media known in the art. Two or more of such computer subsystems may also be effectively coupled by a shared computer-readable storage medium (not shown).

Although the imaging subsystem is described above as being an optical or light-based imaging system, the system may also or alternatively include an electron beam based imaging subsystem configured to generate electron beam images of the specimens, and the one or more computer subsystems are configured for receiving the electron beam images from the electron beam based imaging subsystem. In one such embodiment, the electron beam based imaging subsystem may be configured to direct electrons to or scan electrons over the specimen and to detect electrons from the specimen. In one such embodiment shown in FIG. 1a, the electron beam based imaging subsystem includes electron column 122 coupled to computer subsystem 124.

Figure 1A:
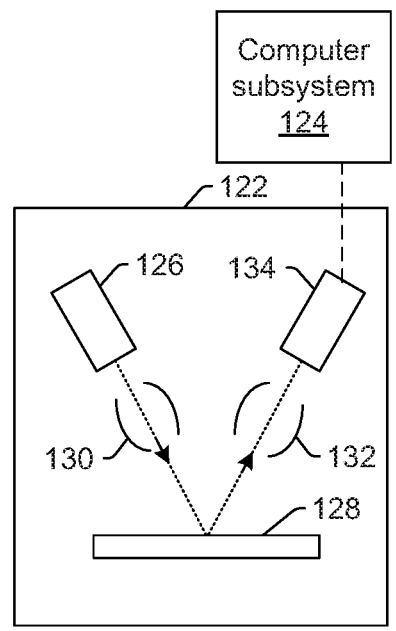

As also shown in FIG. 1a, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 1a as being configured such that the electrons are directed to the specimen at an oblique angle of incidence and are scattered from the specimen at another oblique angle, it is to be understood that the electron beam may be directed to and scattered from the specimen at any suitable angles. In addition, the electron beam based imaging subsystem may be configured to use multiple modes to generate images of the specimen as described further herein (e.g., with different illumination angles, collection angles, etc.). The multiple modes of the electron beam based imaging subsystem may be different in any image generation parameters of the electron beam based imaging subsystem.

Computer subsystem 124 may be coupled to detector 134 as described above. The detector may detect electrons returned from the surface of the specimen thereby forming electron beam images of the specimen. The electron beam images may include any suitable electron beam images. Computer subsystem 124 may be configured to perform one or more functions described further herein for the specimen using output generated by detector 134. Computer subsystem 124 may be configured to perform any additional step(s) described herein. A system that includes the electron beam based imaging subsystem shown in FIG. 1a may be further configured as described herein.

It is noted that FIG. 1a is provided herein to generally illustrate a configuration of an electron beam based imaging subsystem that may be included in the embodiments described herein. As with the optical based imaging subsystem described above, the electron beam based imaging subsystem configuration described herein may be altered to optimize the performance of the imaging subsystem as is normally performed when designing a commercial imaging subsystem. In addition, the systems described herein may be implemented using an existing system (e.g., by adding functionality described herein to an existing system) such as the eSxxx and eDR-xxxx series of tools that are commercially available from KLA-Tencor. For some such systems, the embodiments described herein may be provided as optional functionality of the system (e.g., in addition to other functionality of the system). Alternatively, the system described herein may be designed "from scratch" to provide a completely new system.

Although the imaging subsystem is described above as being a light-based or electron beam-based imaging subsystem, the imaging subsystem may be an ion beam-based imaging subsystem. Such an imaging subsystem may be configured as shown in FIG. 1a except that the electron beam source may be replaced with any suitable ion beam source known in the art. In addition, the imaging subsystem may be any other suitable ion beam-based imaging subsystem such as those included in commercially available focused ion beam (FIB) systems, helium ion microscopy (HIM) systems, and secondary ion mass spectroscopy (SIMS) systems.

As noted above, the optical and electron beam based imaging subsystems may be configured for directing energy (e.g., light, electrons) to and/or scanning energy over a physical version of the specimen thereby generating actual images for the physical version of the specimen. In this manner, the optical and electron beam based imaging subsystems may be configured as "actual" imaging systems, rather than "virtual" systems. For example, a storage medium (not shown) and computer subsystem(s) 102 shown in FIG. 1 may be configured as a "virtual" system. In particular, the storage medium and the computer subsystem(s) are not part of imaging subsystem 10 and do not have any capability for handling the physical version of the specimen. In other words, in systems configured as virtual systems, the output of its one or more "detectors" may be output that was previously generated by one or more detectors of an actual system and that is stored in the virtual system, and during the "imaging and/or scanning," the virtual system may replay the stored output as though the specimen is being imaged and/or scanned. In this manner, imaging and/or scanning the specimen with a virtual system may appear to be the same as though a physical specimen is being imaged and/or scanned with an actual system, while, in reality, the "imaging and/or scanning" involves simply replaying output for the specimen in the same manner as the specimen may be imaged and/or scanned. Systems and methods configured as "virtual" inspection systems are described in commonly assigned U.S. Pat. No. 8,126,255 issued on Feb. 28, 2012 to Bhaskar et al, and U.S. Pat. No. 9,222,895 issued on Dec. 29, 2015 to Duffy et al., both of which are incorporated by reference as if fully set forth herein. The embodiments described herein may be further configured as described in these patents. For example, the one or more computer subsystems described herein may be further configured as described in these patents.

As further noted above, the imaging subsystem may be configured to generate images of the specimen with multiple modes. In general, a "mode" can be defined by the values of parameters of the imaging subsystem used for generating images of a specimen or the output used to generate images of the specimen. Therefore, modes that are different may be different in the values for at least one of the imaging parameters of the imaging subsystem. For example, in one embodiment of an optical based imaging subsystem, at least one of the multiple modes uses at least one wavelength of the light for illumination that is different from at least one wavelength of the light for illumination used for at least one other of the multiple modes. The modes may be different in the illumination wavelength as described further herein (e.g., by using different light sources, different spectral filters, etc.) for different modes. In another embodiment, at least one of the multiple modes uses an illumination channel of the imaging subsystem that is different from an illumination channel of the imaging subsystem used for at least one other of the multiple modes. For example, as noted above, the imaging subsystem may include more than one illumination channel. As such, different illumination channels may be used for different modes.

In one embodiment, the system includes an inspection subsystem configured to generate output for the specimens, and the one or more computer subsystems are configured for receiving the output from the inspection subsystem and detecting defects on the specimens based on the output. For example, the optical and electron beam imaging subsystems described herein may be configured as inspection subsystems. The computer subsystem(s) may be configured to receive the output from the inspection subsystem as described above (e.g., from detector(s) of the imaging subsystem) and may be configured to detect defects on the specimens based on the output in any suitable manner. For example, the computer subsystem(s) may be configured to compare the output to one or more thresholds, any output that is above the one or more thresholds may be identified by the computer subsystems) as defects or potential defects, and any output that is not above the one or more thresholds may be identified by the computer subsystem(s) as not defects or not potential defects. However, the computer subsystem(s) may be configured to use any suitable algorithm(s) and/or methods) detect defects on the specimens based on the output.

In another embodiment, the system includes a defect review subsystem configured to generate output for defects detected on the specimen, and the computer subsystem(s) are configured for receiving the output from the defect review subsystem and determining properties of the defects detected on the specimens based on the output. For example, the optical and electron beam imaging subsystems described herein may be configured as defect review subsystems. The computer subsystem(s) may be configured to receive the output from the defect review subsystem as described above e.g., from detector(s) of the imaging subsystem) and may be configured to determine properties of the defects on the specimens based on the output in any suitable manner. For example, the computer subsystem(s)) may be configured to use the output, to determine one or more properties such as size and shape of the detects using any suitable algorithm(s) and/or method(s) known in the art.

In a further embodiment, the system includes a metrology subsystem configured to generate output for the specimens, and the one or more computer subsystems are configured for receiving the output from the metrology subsystem and determining properties of the specimens based on the output. For example, the optical and electron beam imaging subsystems described herein may be configured as metrology subsystems. The computer subsystem(s) may be configured to receive the output from the metrology subsystem as described above (e.g., from detector(s) of the imaging subsystem) and may be configured to determine properties of the specimens based on the output in any suitable manner. For example, the computer subsystem(s) may be configured to use the output to determine one or more properties such as size and shape of the patterned features formed on the specimens using any suitable algorithm(s) and/or method(s) known in the art.

The embodiments of the imaging subsystems described herein and shown in FIGS. 1 and 1a may be modified in one or more parameters to provide different imaging capability depending on the application for which they will be used. In one such example, the imaging subsystem shown in FIG. 1 may be configured to have a higher resolution if it is to be used for defect review or metrology rather than for inspection. In other words, the embodiments of the imaging subsystem shown in FIGS. 1 and 1a describe some general and various configurations for an imaging subsystem that can be tailored in a number of manners that will be obvious to one skilled in the art, to produce imaging subsystems having different imaging capabilities that are more or less suitable for different applications.

The inspection subsystem, defect review subsystem, and metrology subsystem may also be configured for inspection, defect review, and metrology of specimens such as wafers and reticles. For example, the embodiments described herein may be configured for training a machine learning based model that performs one or more simulations for the purposes of mask inspection, wafer inspection, and wafer metrology. In particular, the embodiments described herein may be installed on a computer node or computer cluster that is a component of or coupled to an imaging subsystem such as a broadband plasma inspector, an electron beam inspector or defect review tool, a mask inspector, a virtual inspector, etc. In this manner, the embodiments described herein may perform simulations that can be used for a variety of applications that include, but are not limited to, wafer inspection, mask inspection, electron beam inspection and review, metrology, etc. The characteristics of the imaging subsystems shown in FIGS. 1 and 1a can be modified as described above based on the specimen for which it will generate actual images.

In another embodiment, the system includes a semiconductor fabrication subsystem configured to perform one or more fabrication processes on the specimen. For example, as shown in FIG. 1, the system may include semiconductor fabrication subsystem 106, which may be coupled to computer subsystem(s) 102 and/or any other elements of the system described herein. The semiconductor fabrication subsystem may include any semiconductor fabrication tool and/or chamber known in the art such as a lithography track, an etch chamber, a chemical mechanical polishing (CMP) tool, a deposition chamber, a stripping or cleaning chamber, and the like. Examples of suitable semiconductor fabrication tools that may be included in the embodiments described herein are described in U.S. Pat. No. 6,891,627 to Levy et al. issued on May 10, 2005, which is incorporated by reference as if fully set forth herein. The embodiments described herein may be further configured as described in this patent.

As described above, therefore, the one or more computer subsystems described herein may be included in a system with one or more other subsystems with actual wafer handling and/or processing capability (e.g., imaging subsystems, inspection subsystems, defect review subsystems, metrology subsystems, semiconductor fabrication process subsystems). In this manner, the embodiments described herein may be configured as predictive systems including data in situ inside any semiconductor platform such as a metrology tool, an inspection tool, an etch chamber, etc. that has detector(s) and a computational platform to learn a model of its world (e.g., defects on a wafer in the case of a semiconductor inspector). However, the one or more computer subsystems described herein may be included in a system that does not include one or more subsystems that have actual wafer handling and/or processing capability. In this manner, the embodiments described herein may be configured as a predictive system that includes data ex situ where the data is exported to a persistent storage mechanism. For example, the system may be configured as a virtual system as described further herein that may or may not acquire information from actual physical wafers generated by other systems and/or methods. In particular, another system or method may generate information for nominal and/or non-nominal instances of one or more specimens using actual physical specimens and may store that information in a storage medium. The one or more computer subsystems described herein may then acquire such information from the storage medium.

The component(s), e.g., component(s) 100 shown in FIG. 1, executed by the computer subsystem(s), e.g., computer subsystems 36 and/or 102, include machine learning based model 104. The machine learning based model is configured for performing one or more simulations for specimens, and the machine learning based model is trained with only information for nominal instances of one or more of the specimens. The training with only the nominal instances of the one or more specimens may be considered as a kind of initial training that is followed by the re-training described further herein. For example, prior to being capable of giving a prediction, such a machine learning based model typically will need to be trained after it has been given a set of examples to learn from. Training the machine learning based model with only the nominal instances may be performed by the one or more computer subsystems described herein. However, training the machine learning based model with only the nominal instances may be performed by another system or method, and the trained machine learning based model may be acquired from the other system or method (or a storage medium in which the trained machine learning based model has been stored by the other system or method) and then re-trained by the computer subsystem(s) described herein.

Machine learning can be generally defined as a type of artificial intelligence (AI) that provides computers with the ability to learn without being explicitly programmed. Machine learning focuses on the development of computer programs that can teach themselves to grow and change when exposed to new data. In other words, machine learning can be defined as the subfield of computer science that "gives computers the ability to learn without being explicitly programmed." Machine learning explores the study and construction of algorithms that can learn from and make predictions on data—such algorithms overcome following strictly static program instructions by making data driven predictions or decisions, through building a model from sample inputs.

The machine learning based model described herein may be further configured as described in "Introduction to Statistical Machine Learning," by Sugiyama, Morgan Kaufmann, 2016, 534 pages; "Discriminative, Generative, and Imitative Learning," Jebara, MIT Thesis, 2002, 212 pages; and "Principles of Data Mining (Adaptive Computation and Machine Learning)" Hand et al., MIT Press, 2001, 578 pages; which are incorporated by reference as if fully set forth herein. The embodiments described herein may be further configured as described in these references.

The one or more nominal instances of the specimens and the training performed using the one or more nominal instances may vary depending on the simulations that will be performed by the machine learning based model and the machine learning based model itself. For example, if the machine learning based model will be used to perform simulations of how the specimens will appear in images of the specimens generated by an imaging system, then the nominal instances of the specimen(s) may include design data for the specimen(s) as well as actual images generated of the specimen(s) on which the design data is printed. The training may then involve providing the nominal instances to the machine learning based model such that the machine learning based model can find (i.e., learn or identify) one or more parameters of the machine learning based model (e.g., weights) that cause the machine learning based model to produce simulated images from the corresponding design information that are substantially the same as the corresponding actual images. Other types of information may be included in the information for the nominal instances used for training the machine learning based model depending on other simulations described herein (e.g., metrology system output and/or measurements with corresponding specimen design information). In addition, the characteristics of the information for the nominal instances may vary depending on the machine learning based model itself in that different types of machine learning based models (such as those described further herein) may require different amounts of information for training (e.g., different numbers of nominal instances). The characteristics of the information for the nominal instances needed for adequate training of any particular machine learning based model can be determined in any suitable manner known in the art.

"Nominal instances" as that term is used herein is generally defined as "instances" of specimens on which no defects are known to be present. For example, the specimen(s) that are nominal may be processed with one or more parameters of one or more processes used to form a design on the specimen(s) that are known to generate non-defective specimens. In other words, the process(es) used to generate the specimen(s) may be known good process(es). In addition, the "nominal instances" of the specimen(s) may include instances (e.g., locations on specimens, whole specimens, etc.) at which no defects have been determined to be present. For example, the nominal instances of the specimen(s) may include locations and/or specimens at which an inspection or other quality control related process (e.g., defect review, metrology, etc.) have not detected any defects. In contrast, the "non-nominal instances" of the specimen(s) as that term is used herein is generally defined as "instances" of the specimen(s) that are "defective" in some manner, either intentionally (via programmed or synthetic defects as described further herein) or unintentionally (via defects discovered on one or more specimens by inspection, defect review, metrology, etc.). In addition, it is noted that a specimen may be "defective" even if no "defects" per se are detected on the specimen. For example, a specimen may be considered "defective" if one or more measurements indicate that one or more characteristics of a design formed on the specimen are outside of a desired range of values for those one or more characteristics.

In one embodiment, performing the one or more simulations includes generating one or more simulated images for one of the specimens, and the one or more simulated images illustrate how the one of the specimens appears in one or more actual images of the one or more specimens generated by an imaging system. For example, the one or more simulations performed by the machine learning based model may generate simulated image(s) illustrating how a specimen appears in actual image(s) generated by one of the imaging systems described herein. In this manner, the simulated image(s) may represent images that may be generated of the specimens by an inspection system, a defect review system, or other imaging system described herein. In one such example, the input to the one or more simulations performed by the machine learning based model may include design information for a specimen (e.g., any of the design data described further herein) and the output of the one or more simulations may include one or more simulated optical or electron beam images illustrating how the specimen on which the design information has been formed will appear in those images.

In one such embodiment, the imaging system is an optical based imaging system. In another such embodiment, the imaging system is an electron beam based imaging system. These imaging systems may be configured as described further herein. In some such embodiments, the one or more simulations performed by the machine learning based model may be performed to generate one or more reference images that is/are used for inspection of specimen(s). In this manner, the embodiments described herein can enable advanced inspection algorithms such as die-to-database defect detection methods and/or algorithms in a manner that are extraordinarily efficient to apply in research and development and manufacturing scenarios. Enabling such defect detection is particularly valuable for electron beam based inspection where throughput is constrained by the rate of area coverage. By limiting image acquisition to "test" images only, throughput can be doubled or tripled versus currently used die-to-die inspection methods. The embodiments described herein may be further configured as described in U.S. patent application Ser. No. 15/353,210 by Bhaskar et al. filed Nov. 16, 2016, which is incorporated by reference as if fully set forth herein. For example, the embodiments described herein may be configured to perform single image detection as described in this patent application.

In another embodiment, performing the one or more simulations includes generating one or more simulated measurements for one of the specimens, and the one or more simulated measurements represent output generated for the one of the specimens by a metrology system. For example, the one or more simulations performed by the machine learning based model may generate simulated measurement(s) (e.g., image(s), output, data, etc.) representing output generated by one of the systems described herein for specimen(s). In this manner, the simulated measurement(s) may represent measurements, images, output, data, etc. that may be generated for the specimens by a metrology system described herein. In one such example, the input to the one or more simulations performed by the machine learning based model may include design information for a specimen (e.g., any of the design data described further herein) and the output of the one or more simulations may include one or more simulated optical or electron beam measurements representing output generated for the specimen by those systems.

The computer subsystem(s) are configured for acquiring information for non-nominal instances of one or more of the specimens on which a process is performed. As will be described further herein, the information for the non-nominal instances will be used for re-training of the machine learning based model thereby performing transfer learning of the non-nominal instances to the machine learning based model. Therefore, acquiring the information for the non-nominal instances may essentially be transfer learning training input generation. Transfer learning training input generation can be performed in a number of ways described further herein including: a) empirical simulation of real defect events on wafers and masks using process design of experiments (DOEs); b) introduction of virtual defect events in design/simulation space by using synthetic approaches; and c) hybrid approaches using empirical plus synthetic methods in concert. In this manner, the embodiments described herein may use process DOEs, simulation and programmed defects to generate training sets for neural networks and other machine learning based models described herein.

Acquiring the information for the non-nominal instances of the specimen(s) may include generating the information. For example, the systems described herein may be configured to generate the information for the non-nominal instances by performing one or more processes on actual specimens (e.g., performing one or more fabrication processes on an actual, physical specimen and then performing one or more measurement and/or imaging processes on the actual physical specimen). Therefore, generating the information for the non-nominal instances may be performed using the computer subsystem(s) described herein with one or more other subsystems described herein (e.g., one or more semiconductor fabrication subsystems, one or more imaging subsystems, one or more metrology subsystems, etc.). In another example, the systems described herein may be configured to generate the information for the non-nominal instances by performing one or more simulations (with or without using actual, physical specimens). In one such example, as described further herein, the one or more computer subsystems may be configured to use another model to generate the information for the non-nominal instances of the specimen(s). Alternatively, the embodiments described herein may be configured to acquire the information for the non-nominal instances of the specimens from a storage medium in which the information has been stored by one or more other methods and/or systems that generated the information.

In one embodiment, the non-nominal instances include instances of defects on the one or more specimens. In this manner, the information for the non-nominal instances may include information for one or more defects on one or more specimens. Such information may be generated in a variety of ways described further herein.

In another embodiment, the non-nominal instances include instances of defects on the one or more specimens, and the one or more specimens include one or more actual specimens on which the process is performed with two or more different values of one or more parameters of the process. For example, for transfer learning training input generation that includes empirical simulation of real defect events on wafers and reticles using DOEs, real world wafers can be leveraged for defects as described further herein.

In one such embodiment, the process is performed with the two or more different values of the one or more parameters of the process in a process window qualification (PWQ) method. For example, one strategy for generating the transfer learning training input is to use DOEs such as PWQ as a generator of systematic defects. The one or more parameters of the process that are varied in the PWQ method may include focus and exposure (e.g., as in a focus-exposure PWQ process). PWQ methods may also be performed as described in U.S. Pat. No. 6,902,855 to Peterson et al. issued on Jun. 7, 2005, U.S. Pat. No. 7,418,124 to Peterson et al. issued on Aug. 26, 2008, U.S. Pat. No. 7,729,529 to Wu et al. issued on Jun. 1, 2010, U.S. Pat. No. 7,769,225 to Kekare et al. issued on Aug. 3, 2010, U.S. Pat. No. 8,041,106 to Pak et al. issued on Oct. 18, 2011, U.S. Pat. No. 8,111,900 to Wu et al. issued on Feb. 7, 2012, and U.S. Pat. No. 8,213,704 to Peterson et al. issued on Jul. 3, 2012, which are incorporated by reference as if fully set forth herein. The embodiments described herein may include any step(s) of any method(s) described in these patents and may be further configured as described in these patents. A PWQ wafer may be printed as described in these patents.

In another such embodiment, the process is performed with the two or more different values of the one or more parameters of the process in a PWQ method designed for overlay margin determination. For example, one strategy for generating the transfer learning training input is to use DOEs such as overlay-PWQ wafers as a generator of systematic defects. Overlay margin determination may be performed in any suitable manner including as described in the above-referenced patents. Therefore, an overlay-PWQ method may be used to print such dies on a specimen, and the non-nominal instances may include instances of any defects detected on such a specimen.

In an additional such embodiment, the process is performed with the two or more different values of the one or more parameters of the process in a focus exposure matrix (FEM) method. For example, one strategy for generating the transfer learning training input is to use DOEs such as FEM methods and/or wafers as a generator of systematic defects. FEM methods generally involve printing a number of dies on a wafer at different combinations of focus and exposure parameter values of a lithography process. The different dies can then be inspected in any suitable manner to detect defects in the different dies. That information is then typically used to determine a process window for the focus and exposure of the lithography process. Therefore, a FEM method may be used to print such dies on a specimen, and the non-nominal instances may include instances of any defects detected on such a specimen.

As described above, therefore, the transfer learning training input generation may use one or more DOEs such as one or more of PWQ, FEM, and overlay-PWQ wafers as generators of systematic defects. In other words, the machine learning based model may be trained by using information generated from a PWQ or FEM wafer that can act as a generator of systematic defects. In general, PWQ is a technique invented by KLA-Tencor in the early 2000s for lithography focus and exposure process window characterization and is widely adopted in one form or another. The basis for PWQ is to create an inspector compatible wafer where there are nominal dice and modulated dice next to each other in a systematic fashion to maximize signal for the inspector. Similar wafers can be made for determining overlay margins. While PWQ and their "cousin" FEM wafers are primarily used for determining process margin today, they can be repurposed for training deep neural networks (or any other machine learning based model described herein) with real defects since they will occur in abundance on a given wafer. These wafers and the information generated from them can then be used as a set of training samples for the re-training described further herein. However, such samples may not provide a complete set of possible defects since there is no guarantee to see all defect types on such wafers. Therefore, the information generated from such wafers may be complemented with other information generated by synthetic defect generation, which may be performed in a number of different manners as described further herein.

In some embodiments, the acquired information is generated from synthetic design data for the one or more specimens produced by an electron design automation (EDA) tool. In this manner, the embodiments described herein may have an added dimension of leveraging synthetic data generated with EDA computer aided design (CAD) tools. The EDA tool may include any suitable commercially available EDA tool. In some such embodiments, one or more of the computer subsystems described herein (e.g., computer subsystem(s) 102) may be configured as an EDA tool or may be a computer subsystem included in an EDA tool.

In a further embodiment, the non-nominal instances include instances of defects on the one or more specimens, and the defects include one or more synthetic defects generated by altering a design for the one or more specimens to create the synthetic defects in the design. "Synthetic" defects as that term is used herein can be generally defined as one or more defects purposefully caused on a specimen, e.g., by manipulation of the design information for the specimen. Therefore, "synthetic" defects may also be referred to as "hypothetical" defects or "programmed" defects. In one such embodiment, for transfer learning training input generation via introduction of virtual defect events in design/simulation space by using synthetic approaches, CAD design can be used to synthetically generate defects (e.g., opens, shorts, protrusions, line ends, metrology markers, etc.) and then be treated by a deep generative or other model as described further herein (to create realistic defects on training images) and/or be used to print the synthetically generated defects on one or more specimens, which can then be used to generate images of the synthetically generated defects on the specimen(s). The CAD work can be automated with a programmable/graphical EDA editor, which may include any suitable FDA software, hardware, system, or method.

In one such embodiment, the one or more components include an inception module configured for altering the design to create the synthetic defects in the design. For example, the machine learning based models described herein may be trained by a defect hallucination system such as those suggested by GoogLeNet inception for natural scene images. A traditional neural network that is pre-trained on defects can then play these backwards to create new defect types on other geometry structures. Examples of systems and methods for performing GoogLeNet inception can be found in "Going Deeper with Convolutions," Szegedy et al., 2015 IEEE Conference on Computer Vision and Pattern Recognition (CVPR), June 2015, 9 pages, which is incorporated by reference as if fully set forth herein. The embodiments described herein may be further configured as described in this reference.

In some embodiments, the nominal instances of the one or more specimens include natural scene images, For example, a model created using natural scene images can be used as a starting point, to fine-tune the model that is trained on semiconductor data (optical or SEM or any other non-nominal instance information described herein). This is an example of transfer learning where low level features learned from training on relatively large amounts of natural images aid in classifying semiconductor defect data. We have demonstrated a 10× reduction in training time when leveraging transfer learning from natural to semiconductor data. In this manner, natural images can be used to accelerate training time on semiconductor data. This reduction in training time is achieved by using the model weights from natural images as the initialization point for the training session that uses semiconductor data. This sharing of weights between natural and semiconductor data can be achieved via any of the transfer learning described herein. As an added benefit, we achieve a 7% increase in classification accuracy when training a model with weights initialized from natural images. The natural scene images used for the nominal instances may include any suitable natural scene images known in the art, including standard natural scene images. In this manner, the nominal instances of the specimens may include non-semiconductor specimens (i.e., not wafers or reticles), while the non-nominal instances of the specimens may include semiconductor specimens (i.e., wafers and reticles). Therefore, the training and the re-training may be performed using different types of specimens. Furthermore, the nominal instances of the specimens may include images of different types of natural scenes (e.g., animals, humans, objects, etc.)

In another embodiment, the nominal instances of the one or more specimens comprise more than one type of data. The more than one type of data may be generated for the same type of specimens (e.g., only wafers or only reticles). In addition, the more than one type of data may be generated using different imaging types (e.g., optical and electron beam). In this manner, a variety of semiconductor data may be used to accelerate the training time for a target dataset. For example, in a variant of the above embodiment, data from various semiconductor data (optical and SEM) can be used to train a model which can then be used as a starting point to train a model on a targeted semiconductor dataset. This approach has a similar impact of learning low level features from natural images and fine-tuning them to semiconductor data. Training data from a variety of semiconductor data helps the model or network to learn low level representations of semiconductor data that can then be transferred to a targeted dataset. This manifestation of transfer learning also accelerates the training time significantly.

In some embodiments, the non-nominal instances include instances of defects on the one or more specimens, the defects include one or more synthetic defects generated by altering a design for the one or more specimens to create the synthetic defects in the design, and the information for the non-nominal instances includes output generated by an imaging or metrology system for the one or more specimens on which the synthetic defects are printed. For example, an example of a transfer learning training input generation method, which uses a hybrid approach involving empirical and synthetic methods in combination, may include generation of synthetic layout defects as described above in design space and determining the empirical impact of those synthetic layout defects on wafers by making masks with the modified design and processing wafers with those masks. In this manner, the machine learning based model can be trained by actual images of programmed defects.

In one embodiment, the non-nominal instances include instances of defects on the one or more specimens, the defects include one or more synthetic defects generated by altering a design for the one or more specimens to create the synthetic defects in the design, and the information for the non-nominal instances includes the altered design. For example, synthetic defects in design can be consumed in isolation without feeding them to a generative mode. The defects created in design do not necessarily have to be legal structures as they act as examples of structures where a nominal pattern is broken for the network to learn. These synthetic defects reduce the dependency on the need tor real pattern defects thereby reducing the data acquisition period which in turn accelerates model training time. In this manner, the embodiments described herein may use synthetic design defects directly (in the absence of a generative model) to reduce training time.

The design process for transfer learning training input generation methods b) and c) described above may leverage process, lithography, and tool simulation capabilities. For example, in another embodiment, the non-nominal instances include instances of defects on the one or more specimens, the defects include one or more synthetic defects generated by altering a design for the one or more specimens to create the synthetic defects in the design, the information for the non-nominal instances includes output of another model, and the output of the other model represents the one or more specimens on which the synthetic defects are printed. One example of an empirically trained process model includes SEMulator 3D, which is commercially available from Coventor, Inc., Cary, N.C. An example of a rigorous lithography simulation model is Prolith, which is commercially available from KLA-Tencor, which can be used in concert with the SEMulator 3D product. However, the other model that is used in this embodiment may include any suitable model of any of the process(es) involved in producing actual specimens from the design data. In this manner, the altered design (altered to include one or more synthetic defects) may be used to simulate what a specimen on which the altered design has been formed will look like in specimen space (not necessarily what such a specimen would look like to a system such as an imaging or metrology system). Therefore, the output of the other model may represent what the specimens would look like in 2D or 3D space of the specimens.

In an additional embodiment, the non-nominal instances include instances of defects on the one or more specimens, the defects include one or more synthetic defects generated by altering a design for the one or more specimens to create the synthetic defects in the design, the information for the non-nominal instances includes output of another model, and the output of the other model illustrates how the one or more specimens on which the synthetic defects are printed appear in one or more actual images of the specimen generated by an imaging system. For example, an additional capability that can be applied is simulation of the inspector whose recipe is being developed. An example of such a model is WINsim, which is commercially available from KLA-Tencor, and which can rigorously model the response of an inspector using an electromagnetic (EM) wave solver. In this manner, defect behavior for programmed defects can be learned in one model and applied in another. Such simulations may be performed for any other imaging subsystems or systems described herein. In addition, such simulations may be performed using any other suitable software, algorithm(s), method(s), or system(s) known in the art.

In a further embodiment, the non-nominal instances include instances of defects on the one or more specimens, the defects include one or more synthetic defects generated by altering a design for the one or more specimens to create the synthetic defects in the design, the information for the non-nominal instances includes output of another model, and the output of the other model represents output generated by a metrology system for the one or more specimens on which the synthetic defects are printed. For example, an additional capability that can be applied is simulation of the metrology tool whose recipe is being developed. In this manner, defect behavior for programmed defects can be learned in one model and applied in another. The output of the metrology system for the one or more specimens on which the synthetic defects are printed may be generated using any suitable model of the metrology system known in the art.

In some embodiments, the non-nominal instances include instances of defects on the one or more specimens, the defects include one or more synthetic defects generated by altering a design for the one or more specimens to create the synthetic defects in the design, the information for the non-nominal instances includes output of another model, the output of the other model represents output generated by another system for the one or more specimens on which the synthetic defects are printed, and the other model is a deep generative model. In one such embodiment, for transfer learning training input generation via introduction of virtual defect events in design/simulation space by using synthetic approaches, CAD design can be used to synthetically generate defects (e.g., opens, shorts, protrusions, line ends, metrology markers, etc.) and then be treated by a deep generative model as described further herein (to create realistic defects on training images). In this manner, defect behavior for programmed defects can be learned in one model and applied in another. The generative model may be used to generate simulated output that represents the output generated by any of the systems described herein (e.g., a semiconductor fabrication system, an inspection system, a defect review system, a metrology system, etc.).

A "generative" model can be generally defined as a model that is probabilistic in nature. In other words, a "generative" model is not one that performs forward simulation or rule-based approaches and, as such, a model of the physics of the processes involved in generating an actual image or output (for which a simulated image or output is being generated) is not necessary. Instead, as described further herein, the generative model can be learned (in that its parameters can be learned) based on a suitable training set of data. As described further herein, such generative models have a number of advantages for the embodiments described herein. In addition, the generative model may be configured to have a deep learning architecture in that the generative model may include multiple layers, which perform a number of algorithms or transformations. The number of layers included in the generative model may be use case dependent. For practical purposes, a suitable range of layers is from 2 layers to a few tens of layers.

In one embodiment, the one or more components include a deep generative model configured to create the information for the nominal instances of the one or more specimens. For example, deep generative models that learn the joint probability distribution (mean and variance) between the SEM (image of actual wafer) and design (e.g., CAD or a vector representation of intended layout) can be used to generate the nominal instances that are used to train the machine learning based model. A generative model may also be used to generate other simulation results described herein for non-nominal instances of the specimen. Once the machine learning based model is trained for nominal (as intended/non-defective) samples, as described further herein, a transfer learning training input dataset, which includes defective images or other non-nominal instances described herein, can be used to re-train the machine learning based model. In addition, a machine learning based model can be pre-trained by using synthetic data that is generated by modifying design data (e.g., CAD or EDA data) used to make semiconductor wafers. Defect artifacts such as opens, shorts, protrusions, intrusions, etc. along with metrology markers such as line end pull backs could be inserted into the CAD and then fed into a generative model trained by a network described in the above-referenced patent application by Zhang et al to create realistic defects.

As further described above, a deep generative model may be used to generate the information for the non-nominal instances of the one or more specimens. The same deep generative model may be used to generate the information for the nominal instances of the one or more specimens. In this manner, a deep generative model may be used for generating nominal (reference) and defective (test) images or other information described herein.

In one embodiment, the machine learning based model is a discriminative model. In this manner, the embodiments may be configured to train a discriminative model. In addition, the discriminative model may be part of an inspection system (e.g., a light based narrow band or broad band inspector, electron beam based inspector, etc.) or other system (e.g., a metrology system, defect review system, etc.) described herein. As such, the embodiments described herein may be configured to train various inspection and/or other systems for discriminative learning. The discriminative model may have any suitable architecture and/or configuration known in the art.

Discriminative models, also called conditional models, are a class of models used in machine learning for modeling the dependence of an unobserved variable y on an observed variable x. Within a probabilistic framework, this is done by modeling the conditional probability distribution $P(y|x)$, which can be used for predicting y from x. Discriminative models, as opposed to generative models, do not allow one to generate samples from the joint distribution of x and y. However, for tasks such as classification and regression that do not require the joint distribution, discriminative models can yield superior performance. On the other hand, generative models are typically more flexible than discriminative models in expressing dependencies in complex learning tasks. In addition, most discriminative models are inherently supervised and cannot easily be extended to unsupervised learning. Application specific details ultimately dictate the suitability of selecting a discriminative versus generative model.

In another embodiment, the machine learning based model is a neural network. For example, the machine learning based model may be a deep neural network with a set of weights that model the world according to the data that it has been fed to train it. Neural networks can be generally defined as a computational approach which is based on a relatively large collection of neural units loosely modeling the way a biological brain solves problems with relatively large clusters of biological neurons connected by axons. Each neural unit is connected with many others, and links can be enforcing or inhibitory in their effect on the activation state of connected neural units. These systems are self-learning and trained rather than explicitly programmed and excel in areas where the solution or feature detection is difficult to express in a traditional computer program.

Neural networks typically consist of multiple layers, and the signal path traverses from front to back. The goal of the neural network is to solve problems in the same way that the human brain would, although several neural networks are much more abstract. Modern neural network projects typically work with a few thousand to a few million neural units and millions of connections. The neural network may have any suitable architecture and/or configuration known in the art.

In a further embodiment, the machine learning based model is a convolutional and deconvolution neural network. For example, the embodiments described herein can take advantage of deep learning concepts such as a convolution and deconvolution neural network to solve the normally intractable representation conversion problem (e.g., rendering). The machine learning based model may have any convolution and deconvolution neural network configuration or architecture known in the art.

The computer subsystem(s) are also configured for re-training the machine learning based model with information for the non-nominal instances of the one or more of the specimens thereby performing transfer learning of the information for the non-nominal instances of the one or more of the specimens to the machine learning based model. For example, a general purpose of the embodiments described herein is to provide systems and methods for simulated and/or empirical inspection and/or metrology of semiconductor devices using efficiently trainable machine learning based models with a limited training set. To this end, a series of transfer learning methods can be used to enable and accelerate the efficient training of machine learning based models in a principled manner. These transfer learning methods and machine learning based models can be used for numerous inspection and metrology applications.

Transfer learning can be generally defined as the improvement of learning in a new task (or a target task) through the transfer of knowledge from a related task that has already been learned (one or more source tasks). In the embodiments described herein, therefore, training the machine learning based model with only the nominal instances involves learning the one or more source tasks, and re-training the machine learning based model with the non-nominal instances transfers the knowledge from the source tasks (the nominal instances) to the target task (the non-nominal instances). In transfer learning, the agent knows nothing about a target task (or even that there will be a target task) while it is learning a source task. For instance, in the embodiments described herein, the machine learning based model knows nothing about the non-nominal instances while it is being trained with the nominal instances.

In general, however, the transfer learning described herein may be performed in any suitable manner known in the art. For example, in an inductive learning task, the objective is to induce a predictive model from a set of training examples. Transfer in inductive learning works by allowing source-task knowledge to affect the target task's inductive bias. In an inductive transfer method, the target-task inductive bias is chosen or adjusted based on the source-task knowledge. The way this is done varies depending on which inductive learning algorithm is used to learn the source and target tasks.

Inductive transfer can be viewed as not only a way to improve learning in a standard supervised-learning task, but also as a way to offset the difficulties posed by tasks that involve relatively small datasets. That is, if there are relatively small amounts of data or class labels for a task, treating it as a target task and performing inductive transfer from a related source task can lead to more accurate models. These approaches therefore use source-task data to enhance target-task data, despite the fact that, the two datasets are assumed to come from different probability distributions.

Transfer learning as described herein can be further performed as described in "Transfer Learning," Torrey et al., Handbook of Research on Machine Learning Applications, published by IGI Global, edited by E. Soria, J. Martin, R. Magdalena, M. Martinez and A. Serrano, 2009, 22 pages, and "How transferable are features in a deep neural network?" Yosinski et al., NIPS 2014, Nov. 6, 2014, 14 pages, which are incorporated by reference as if fully set forth herein. The embodiments described herein may be further configured as described in these references.

The re-training (and training) architecture used by the embodiments described herein is preferably designed to converge to the ground truth (for validation samples) with the minimum number of samples. In one embodiment, the one or more components include one or more additional components, the re-training is performed using the one or more additional components, and the one or more additional components include a common mother network for all layers on the specimens, a grand common mother network for all layers on the specimens, an adversarial network, a deep adversarial generative network, an adversarial autoencoder, a Bayesian Neural Network, a component configured for a variational Bayesian method, a ladder network, or some combination thereof. For example, the transfer learning methods may be applied to the training set(s) generated using any of the transfer learning training input generation methods described herein to train the machine learning based models. There are many potential concepts that apply here. The ones that have a substantially high probability for working with semiconductor wafers include: using a common mother network for front end of line (FEOL), middle of line (MOL), and back end of line (BEOL) layers each; using a grand common mother network for all layers (will likely work on SEM); using an adversarial network to accelerate training; using a Bayesian Neural Network (Variational Bayes), which requires far fewer layers; and using the concept of the ladder network for training. For example, the embodiments described herein are configured for semiconductor wafer and mask inspection and other applications and accelerating training by "legally amplifying" samples. These methods are also known as semi-supervised (a few examples are available, but the vast majority are not labeled by humans or ground truth).

In one such example, the computer subsystem(s) may leverage a pre-trained system of weights using the concept of a mother network. The computer subsystem(s) can also use methods such as semi-supervised methods that combine Bayesian generative modeling to achieve their results in a minimum number of samples. Examples of such methods are described in U.S. patent application Ser. No. 15/176,139 to Zhang et al, filed Jun. 7, 2016, and "Semi-supervised Learning with Deep Generative Models," Kingma et al., NIPS 2014, Oct. 31, 2014, pp. 1-9, which are incorporated by reference as if fully set forth herein. The embodiments described herein may be further configured as described in these references. In addition, the computer subsystem(s) may leverage ladder networks where supervised and unsupervised learning are combined in deep neural networks such as the ones proposed in "Semi-Supervised Learning with Ladder Networks," Rasmus et al., NIPS 2015, Nov. 24, 2015, pp. 1-19, which is incorporated by reference as if fully set forth herein. The embodiments described herein may be further configured as described in this reference. The computer subsystem(s) described herein may further be configured to train the machine learning based model using a deep adversarial generative network of the type described in "Generative Adversarial Nets" Goodfellow et al., Jun. 10, 2014, pp. 1-9, which is incorporated by reference as if fully set forth herein. The embodiments described herein may be further configured as described in this reference. In addition or alternatively, the computer subsystem(s) described herein may be configured to train the machine learning based model using an adversarial autoencoder (a method that combines a variational autoencoder (VAE) and a deep generative adversarial network (DGAN)) such as that described in "Adversarial Autoencoders," Makhzani et al., arXiv: 1511.05644v2, May 25, 2016, 16 pages, which is incorporated by reference as if fully set forth herein. The embodiments described herein may be further configured as described in this reference. In some instances, the computer subsystem(s) may be configured to perform Bayesian Learning as described in "Bayesian Learning for Neural Networks," Neal, Springer-Verlag New York, 1996, 204 pages, which is incorporated by reference as if fully set forth herein. The embodiments described herein may be further configured as described in this reference. The computer subsystem(s) may also be configured to perform the variational Bayes method as described in "The Variational Bayes Method in Signal Processing," Šmidl, Springer-Verlag Berlin Heidelberg, 2006, 228 pages, which is incorporated by reference as if fully set forth herein. The embodiments described herein may be further configured as described in this reference.

In another embodiment, the re-training includes transferring all weights of convolutional layers of the trained machine learning based method and fine tuning weights of fully connected layers of the trained machine learning based method. For example, the re-training may include transferring all the weights of the convolution layers (e.g., layers 1-3) and then fine tuning the fully connected layers only. In another example, a machine learning based model such as those described herein may be pre-trained by a method known as transfer learning that copies the weights from the mother network for the early layers and fine tunes the latter layers where the classification specialization occurs. Re-training may, however, include altering any one or more trainable parameters of the machine learning based model. In addition, the one or more parameters of the machine learning based model that are trained by the embodiments described herein may include one or more weights for any layer of the machine learning based model that has trainable weights. In one such example, the weights may include weights for the convolution layers but not pooling layers.

Figure 2:
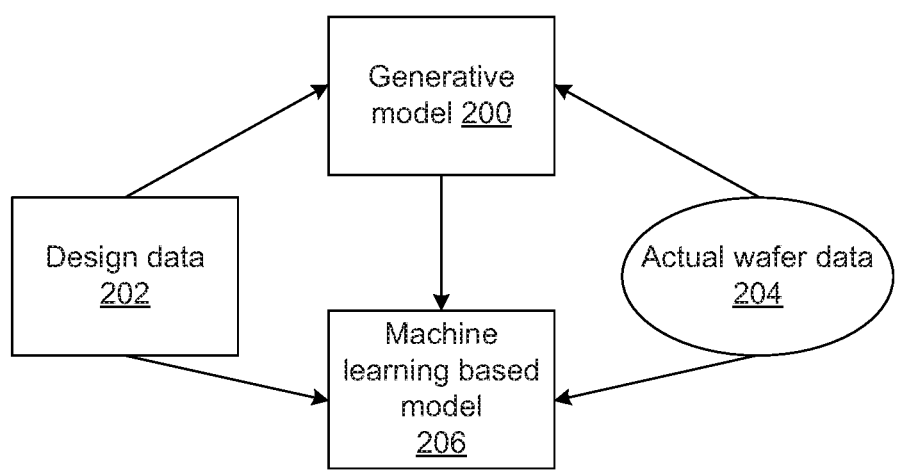
FIG. 2 is a flow chart illustrating steps that may be performed by the embodiments described herein.

FIG. 2 illustrates one embodiment of machine learning based model re-training that may be performed by the embodiments described herein. For example, one or more deep generative methods (DGMs) that can learn nominal (designer intent) structures and generate simulated optical and SEM images may be used by the embodiments described herein to generate information for the nominal instances that is used to train the machine learning based model. In one such example, generative model 200 may be used to generate the information for the nominal instances. The generative model may learn the joint probability distribution (e.g., mean and variance) between an actual image of an actual wafer (e.g., a SEM image) and design (e.g., CAD or a vector representation of intended layout). The generative model may be configured to perform any other simulations described herein and may have any configuration described herein.

The information for the nominal instances may be used to train machine learning based model 206, which may be performed as described further herein. Once a neural network is trained for nominal (as intended/non-defective) samples, the defect induced design may be used to generate synthetic data that looks substantially similar to the real world data (such as the PWQ data and/or defect proxies designed into the structures printed on the wafers). For example, as shown in FIG. 2, design data 202 may be altered as described herein to generate synthetic defects in the design data. That altered design data may be input to generative model 200 to generate information for the non-nominal instances (i.e., the synthetic defects) of the one or more specimens based on the altered design data. The information for the non-nominal instances generated in this manner may also be provided to machine learning based model 206 for re-training of the model, which may be performed as described further herein. The design data and/or the altered design data may also be provided to the machine learning based model so that the design data and/or the altered design data can be used for one or more steps performed by the machine learning based model.

As further shown in FIG. 2, actual wafer data 204 may be generated as described further herein (e.g., using PWQ and/or FEM training wafers). That actual wafer data may be provided to generative model 200, so that the actual wafer data may be used to train and/or update the generative model. That actual wafer data may also be provided to machine learning based model 206 so that re-training of the machine learning based model may be performed using the actual wafer data, which may be performed as described further herein.

The machine learning based model described herein may be generated for specific specimens (e.g., specific wafers or reticles), processes, imaging parameters, etc. In other words, the machine learning based models described herein may be specimen specific, process specific, imaging parameter specific, etc. In this manner, different machine learning based models may be generated for different wafer layers. In addition, different machine learning based models may be generated for different sets of imaging parameters (e.g., different imaging modes). Each of the different models may be generated with different training sets of data. Each of the different training sets of data may be generated as described further herein.

The embodiments described herein have a number of advantages described further herein. In addition, the embodiments described herein can enable a 100-1000× acceleration of achieving a trained image generation model usable for inspection and metrology applications.

Each of the embodiments of each of the systems described above may combined together into one single embodiment.

Another embodiment relates to a computer-implemented method for training a machine learning based model. The method includes acquiring information for non-nominal instances of one or more specimens on which a process is performed. A machine learning based model is configured for performing one or more simulations for the specimens, and the machine learning based model is trained with only information for nominal instances of one or more additional specimens. The method also includes re-training the machine learning based model with the information for the non-nominal instances of the one or more specimens thereby performing transfer learning of the information for the non-nominal instances of the one or more specimens to the machine learning based model. The acquiring and re-training are performed by one or more computer systems. One or more components are executed by the one or more computer systems, and the one or more components include the machine learning based model.

Each of the steps of the method may be performed as described further herein. The method may also include any other step(s) that can be performed by the system, computer system(s), and/or machine learning based models described herein. The computer system(s) may be configured according to any of the embodiments described herein, e.g., computer subsystem(s) 102. In addition, the method described above may be performed by any of the system embodiments described herein.

Figure 3:
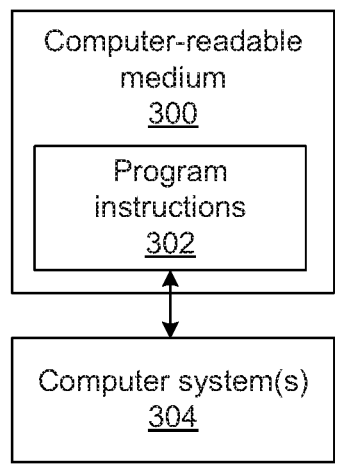
FIG. 3 is a block diagram illustrating one embodiment of a non-transitory computer-readable medium storing program instructions for causing computer system(s) to perform a computer-implemented method described herein.

An additional embodiment relates to a non-transitory computer-readable medium storing program instructions executable on one or more computer systems for performing a computer-implemented method for training a machine learning based model. One such embodiment is shown in FIG. 3. In particular, as shown in FIG. 3, non-transitory computer-readable medium 300 includes program instructions 302 executable on computer system(s) 304. The computer-implemented method may include any step(s) any method(s) described herein.

Program instructions 302 implementing methods such as those described herein may be stored on computer-readable medium 300. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system(s) 304 may be configured according to any of the embodiments described herein.

Further modifications and alternative embodiments of various aspects of the invention will be apparent to those skilled in the art in view of this description. For example, methods and systems for accelerated training of a machine learning based model for semiconductor applications are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to train a machine learning based model, comprising:
   one or more computer subsystems; and
   one or more components executed by the one or more computer subsystems and stored on a non-transitory computer-readable medium, wherein the one or more components comprise:
      a machine learning based model configured for performing one or more simulations for specimens, wherein the machine learning based model is initially trained with only information for nominal instances of one or more of the specimens;
   wherein the one or more computer subsystems are configured for:
      acquiring information for non-nominal instances of one or more of the specimens on which a process is performed; and
      re-training the machine learning based model with the information for the non-nominal instances of the one or more of the specimens thereby performing transfer learning of the information for the non-nominal instances of the one or more of the specimens to the machine learning based model.

2. The system of claim 1, wherein performing the one or more simulations comprises generating one or more simulated images for one of the specimens, and wherein the one or more simulated images illustrate how the one of the specimens appears in one or more actual images of the one of the specimens generated by an imaging system.

3. The system of claim 2, wherein the imaging system is an optical based imaging system.

4. The system of claim 2, wherein the imaging system electron beam based imaging system.

5. The system of claim 1, wherein performing the one or more simulations comprises generating one or more simulated measurements for one of the specimens, and wherein the one or more simulated measurements represent output generated for the one of the specimens by a metrology system.

6. The system of claim 1, wherein the non-nominal instances comprise instances of defects on the one or more specimens.

7. The system of claim 1, wherein the non-nominal instances comprise instances of defects on the one or more specimens, and wherein the one or more specimens comprise one or more actual specimens on which the process is performed with two or more different values of one or more parameters of the process.

8. The system of claim 7, wherein the process is performed with the two or more different values of the one or more parameters of the process in a process window qualification method.

9. The system of claim 7, wherein the process is performed with the two or more different values of the one or more parameters of the process in a process window qualification method designed for overlay margin determination.

10. The system of claim 7, wherein the process is performed with the two or more different values of the one or more parameters of the process in a focus exposure matrix method.

11. The system of claim 1, wherein the acquired information is generated from synthetic design data for the one or more specimens produced by an electronic design automation tool.

12. The system of claim 1, wherein the non-nominal instances comprise instances of defects on the one or more specimens, and wherein the defects comprise one or more synthetic defects generated by altering a design for the one or more specimens to create the synthetic defects in the design.

13. The system of claim 12, wherein the one or more components further comprise an inception module configured for altering the design to create the synthetic defects in the design.

14. The system of claim 1, wherein the non-nominal instances comprise instances of defects on the one or more specimens, wherein the defects comprise one or more synthetic detects generated by altering a design for the one or more specimens to create the synthetic defects in the design, and wherein the information for the non-nominal instances comprises output generated by an imaging or metrology system for the one or more specimens on which the synthetic defects are printed.

15. The system of claim 1, wherein the non-nominal instances comprise instances of defects on the one or more specimens, wherein the defects comprise one or more synthetic defects generated by altering a design for the one or more specimens to create the synthetic defects in the design, wherein the information for the non-nominal instances comprises output of another model, and wherein the output of the other model represents the one or more specimens on which the synthetic defects are printed.

16. The system of claim 1, wherein the non-nominal instances comprise instances of defects on the one or more specimens, wherein the defects comprise one or more synthetic defects generated by altering a design for the one or more specimens to create the synthetic defects in the design, wherein the information for the non-nominal instances comprises output of another model, and wherein the output of the other model illustrates how the one or more specimens on which the synthetic defects are printed appear in one or more actual images of the one or more specimens generated by an imaging system.

17. The system of claim 1, wherein the non-nominal instances comprise instances of defects on the one or more specimens, wherein the defects comprise one or more synthetic defects generated by altering a design for the one or more specimens to create the synthetic defects in the design, wherein the information for the non-nominal instances comprises output of another model, and wherein the output of the other model represents output generated by a metrology system for the one or more specimens on which the synthetic defects are printed.

18. The system of claim 1, wherein the non-nominal instances comprise instances of defects on the one or more specimens, wherein the defects comprise one or more synthetic defects generated by altering a design for the one or more specimens to create the synthetic defects in the design, wherein the information for the non-nominal instances comprises output of another model, wherein the output of the other model represents output generated by another system for the one or more specimens on which the synthetic defects are printed, and wherein the other model is a deep generative model.

19. The system of claim 1, wherein the non-nominal instances comprise instances of defects on the one or more specimens, wherein the defects comprise one or more synthetic defects generated by altering a design for the one or more specimens to create the synthetic defects in the design, and wherein the information for the non-nominal instances comprises the altered design.

20. The system of claim 1, wherein the one or more components further comprise a deep generative model configured to create the information for the nominal instances of the one or more specimens.

21. The system of claim 1, wherein the nominal instances of the one or more specimens comprise natural scene images.

22. The system of claim 1, wherein the nominal instances of the one or more specimens comprise more than one type of data.

23. The system of claim 1, wherein the machine learning based model is a discriminative model.

24. The system of claim 1, wherein the machine learning based model is a neural network.

25. The system of claim 1, wherein the machine learning based model is a convolution and deconvolution neural network.

26. The system of claim 1, wherein the one or more components further comprise one or more additional components, wherein the re-training is performed using the one or more additional components, and wherein the one or more additional components comprise a common mother network for all layers on the specimens, a grand common mother network for all layers on the specimens, an adversarial network, a deep adversarial generative network, an adversarial autoencoder, a Bayesian Neural Network, a component configured for a variational Bayesian method, a ladder network, or some combination thereof.

27. The system of claim 1, wherein the re-training comprises transferring all weights of convolutional layers of the initially trained machine learning based method and fine tuning weights of fully connected layers of the initially trained machine learning based method.

28. The system of claim 1, further comprising an electron beam based imaging subsystem configured to generate electron beam images of the specimens, wherein the one or more computer subsystems are further configured for receiving the electron beam images from the electron beam based imaging subsystem.

29. The system of claim 1, further comprising an optical based imaging subsystem configured to generate optical images of the specimens, wherein the one or more computer subsystems are further configured for receiving the optical images from the optical based imaging subsystem.

30. The system of claim 1, further comprising an inspection subsystem configured to generate output for the specimens, wherein the one or more computer subsystems are further configured for receiving the output from the inspection subsystem and detecting defects on the specimens based on the output.

31. The system of claim 1, further comprising a defect review subsystem configured to generate output for defects detected on the specimens, wherein the one or more computer subsystems are further configured for receiving the output from the defect review subsystem and determining properties of the defects detected on the specimens based on the output.

32. The system of claim 1, further comprising a metrology subsystem configured to generate output for the specimens, wherein the one or more computer subsystems are further configured for receiving the output from the metrology subsystem and determining properties of the specimens based on the output.

33. The system of claim 1, further comprising a semiconductor fabrication subsystem configured to perform one or more fabrication processes on the specimens.

34. The system of claim 1, wherein the specimens comprise wafers.

35. The system of claim 1, wherein the specimens comprise reticles.

36. A non-transitory computer-readable medium, storing program instructions executable on one or more computer systems for performing a computer-implemented method for training a machine learning based model, wherein the computer-implemented method comprises:

acquiring information for non-nominal instances of one or more specimens on which a process is performed, wherein a machine learning based model is configured for performing one or more simulations for the specimens, and wherein the machine learning based model is initially trained with only information for nominal instances of one or more additional specimens; and re-training the machine learning based model with the information for the non-nominal instances of the one or more specimens thereby performing transfer learning of the information for the non-nominal instances of the one or more specimens to the machine learning based model, wherein said acquiring and said re-training are performed by the one or more computer systems, wherein one or more components are executed by the one or more computer systems, and wherein the one or more components comprise the machine learning based model.

37. A computer-implemented method for training a machine learning based model, comprising:

acquiring information for non-nominal instances of one or more specimens on which a process is performed, wherein a machine learning based model is configured for performing one or more simulations for the specimens, and wherein the machine learning based model is initially trained with only information for nominal instances of one or more additional specimens; and re-training the machine learning based model with the information for the non-nominal instances of the one or more specimens thereby performing transfer learning of the information for the non-nominal instances of the one or more specimens to the machine learning based model, wherein said acquiring and said re-training are performed by one or more computer systems, wherein one or more components are executed by the one or more computer systems, and wherein the one or more components comprise the machine learning based model.

* * * * *